United States Patent
Jorgensen

(10) Patent No.: US 6,915,225 B2
(45) Date of Patent: Jul. 5, 2005

(54) METHOD, APPARATUS AND SYSTEM FOR DIGITAL DATA RESAMPLING UTILIZING FOURIER SERIES BASED INTERPOLATION

(75) Inventor: Jerry D. Jorgensen, Bellevue, WA (US)

(73) Assignee: Northrop Grumman Corporation, Los Angeles, CA (US)

( * ) Notice: Subject to any disclaimer, the term of this patent is extended or adjusted under 35 U.S.C. 154(b) by 82 days.

(21) Appl. No.: 10/438,426

(22) Filed: May 15, 2003

(65) Prior Publication Data

US 2004/0230391 A1 Nov. 18, 2004

(51) Int. Cl.[7] .............................................. G06F 19/00
(52) U.S. Cl. ......................................... 702/77; 708/313
(58) Field of Search .............................. 702/66, 70, 73, 702/74, 75, 76, 77, 79, 124–126, 179, 189, 190, 197; 358/3.03–3.07; 348/461, 466; 708/290, 313; 324/76.21

(56) References Cited

U.S. PATENT DOCUMENTS

| | | | | | |
|---|---|---|---|---|---|
| 5,257,110 A | * | 10/1993 | Ohashi | .................... | 386/90 |
| 5,258,938 A | * | 11/1993 | Akamatsu | .................... | 708/290 |
| 5,335,089 A | * | 8/1994 | Xie et al. | .................... | 358/3.03 |
| 5,473,555 A | * | 12/1995 | Potter | .................... | 708/313 |
| 5,493,339 A | * | 2/1996 | Birch et al. | .................... | 348/461 |
| 6,064,614 A | * | 5/2000 | Khoury | .................... | 365/207 |
| 6,211,663 B1 | * | 4/2001 | Moulthrop et al. | ...... | 324/76.23 |
| 6,272,200 B1 | * | 8/2001 | Pan et al. | .................... | 378/15 |
| 6,282,257 B1 | * | 8/2001 | Basu et al. | .................... | 378/15 |
| 6,748,098 B1 | * | 6/2004 | Rosenfeld | .................... | 382/131 |

* cited by examiner

Primary Examiner—Marc S. Hoff
Assistant Examiner—Mohamed Charioui
(74) Attorney, Agent, or Firm—Amin & Turocy, LLP

(57) ABSTRACT

The present invention provides a methodology, apparatus and system for resampling digital data utilizing a Fourier series based interpolation engine 104. A quick means to up-sample or down-sample data is provided without requiring computationally intensive processing. This is accomplished by utilizing low order coefficients of terms of a complete Fourier series expansion for a continuous signal. The summation of the expansion is limited to input samples immediately adjacent in time to the desired output. Generally speaking, the output is normally required to be a constant sampling rate, therefore, the input and output rates are related by an integer ratio. This ratio can be greater or smaller than one, providing up-sampling or down-sampling as appropriate. By employing the present invention, a DSP engine can be constructed that is adjustable to any ratio of sampling rates in a computationally efficient manner with low RMS error while preserving convolution through the resampling process.

19 Claims, 13 Drawing Sheets

METHOD, APPARATUS AND SYSTEM FOR DIGITAL DATA RESAMPLING UTILIZING FOURIER SERIES BASED INTERPOLATION

This invention was made with Government support under Contract Number DAAH23-00-C-A001 awarded by the United States Department of Defense to TRW Corporation, and the United States Government has certain rights in this invention.

BACKGROUND OF THE INVENTION

1. Field of the Invention

The present invention relates to a system, apparatus and methodology for digital signal processing, and in particular to finite sampling digital signal processing utilizing Fourier series.

2. Discussion of the Related Art

Digital signal processing (DSP) has permeated into every aspect of modern society. It is utilized in everything from devices that help to create the world-wide web to EKG machines found in hospitals. Generally, any device that requires a signal to be processed by a computer employs digital signal processing. The development of DSP technologies has allowed microprocessors and computers to come of age. DSP is the bridge between the real world "analog" or continuous signals and the microprocessor and computer's required discrete or "digital" domain. For this reason, advancements in DSP technology have afforded breakthroughs in many other areas dependent on information gathered through signal characteristics. These include progressions in the health industries, sciences, engineering and even weather prediction.

This art of taking a continuous or analog signal and creating a representative signal in a digital domain has its beginnings several centuries ago. That statement is normally surprising to most people since the introduction of computers and microprocessors are relatively new compared to the time when Gauss and Newton were providing history with their groundbreaking theories. So, despite being based on centuries-old fundamentals, DSP technologies have mainly progressed in more recent times. The methods of transposing the continuous signals into the digital domain have varied greatly during that time. In order to preserve the fidelity of the original continuous signals, great pains were taken to reproduce every nuance in the digital realm. This led to extremely complex equations which took a tremendous amount of time to process. Thus, the processing "delay" prevented DSP technologies from being utilized "real-time."

Since DSP, at times, was not fast enough to process continuous signals in real-time, great emphasis was placed on reducing the delay caused by the processing. Advancements in this area of DSP technologies proved to be very beneficial to a multitude of industries and sciences. More information could be gathered, processed, analyzed and used to control or solve many problems as they occurred as close to real-time as possible. This led to an even greater emphasis on speeding up the processing and maintaining accuracy of the conversion of continuous to digital signals. More advancements in the speeds of microprocessors and computers allowed for faster processing even without advancements in the DSP methodologies. Although, these types of progressions will always facilitate the DSP technologies, they will not be able to replace nor match advancements in the art of DSP itself.

The advancement of DSP technologies could be construed to hold the key to advancing a multitude of extremely diverse areas of human intelligence, possibly even being considered a cornerstone in mankind's development. This holds true due to the continued dependence of our sciences on computer and microprocessor technologies in every facet of our lives. Its importance cannot be underestimated in the development of our modern societies. Even a minute incremental advancement is paramount when one understands the thousands of areas that will benefit from that one tiny step forward.

Today, DSP technologies are greatly focused on being faster, more accurate and easier to implement than ever before. We are also challenged by the current rate of microprocessor and computer technological advancements. Every day it seems that they increase their speed two-fold. Older devices become obsolete in a matter of months instead of the previous years. This leaves devices that were implemented at great expense useless to utilize methodologies that are being developed for faster and faster processors. Many industries and sciences cannot afford to constantly upgrade equipment to keep up with the ever exponentially changing processor technology. They are left trying to implement DSP technology designed for a 3 Gigahertz processor in a 100 Megahertz processing device, overwhelmed by the increasing DSP latencies.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates generally to digital signal processing (DSP) engines, and in particular, to digital signal processing engines that resample utilizing Fourier series based interpolation. By utilizing such type of DSP engine, a signal can be resampled faster and with higher fidelity while employing conventional processing devices, thereby permitting real-time processing capabilities and resampling functionality to pre-existing platforms. The present invention facilitates DSP devices by increasing functionality to include up-sampling and down-sampling capabilities. The present invention also provides for low latency processing to be performed on a variety of signal types. The subject invention also facilitates inherent value of pre-existing platforms by providing increased life expectancy through enhancement of the platform's capabilities.

More particularly, the subject invention utilizes for example a Fourier series based interpolation engine which up-samples and/or down-samples data while mitigating computationally intensive processing for equivalent signal fidelity as compared to conventional systems and methodologies. This is accomplished for example by employing low order coefficients of terms of a complete Fourier series expansion for a continuous signal. The summation of the expansion is limited to input samples adjacent in time to the desired output providing a "limited range" for the Fourier series expansion. Thus, in accordance with the subject invention, a digital resampling engine can be constructed that is adjustable to substantially any ratio of sampling rates in a computationally efficient manner with low RMS (root mean squared) error while preserving convolution through the resampling process. Since efficiencies are obtained in processor usage, and flexibility is gained in the sampling input range, the present invention reduces implementation costs, increases reuse of existing DSP implementing platforms, and maintains low latency throughput.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

Figure 1:
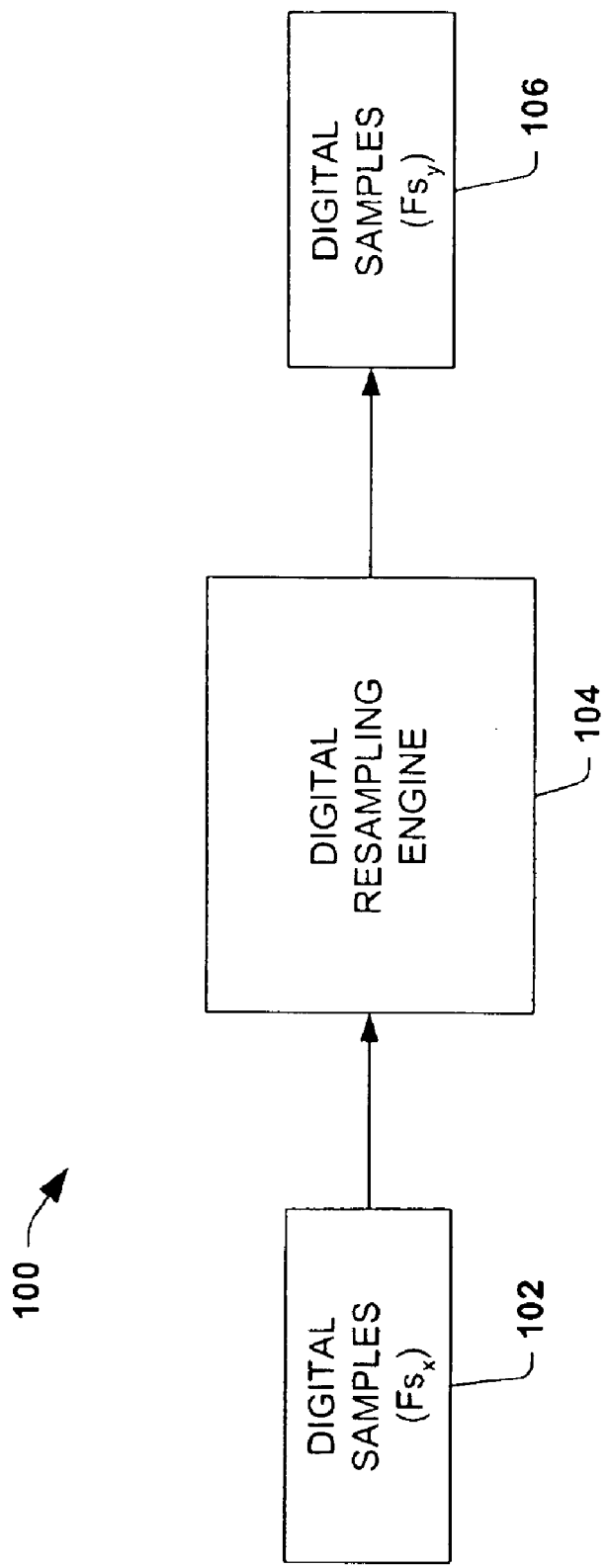
FIG. 1 is a block diagram of a digital resampling engine in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the term "computer component" is intended to refer to a computer-related entity, either hardware, a combination of hardware and software, software, or software in execution. For example, a computer component may be, but is not limited to being, a process running on a processor, a processor, an object, an executable, a thread of execution, a program, and/or a computer. By way of illustration, both an application running on a server and the server can be a computer component. One or more computer components may reside within a process and/or thread of execution and a component may be localized on one computer and/or distributed between two or more computers.

As noted above, the present invention provides a methodology, apparatus and system for resampling digital data utilizing a Fourier series based interpolation engine. A quick means to up-sample or down-sample data is provided without requiring computationally intensive processing. This is accomplished by utilizing low order coefficients of terms of a complete Fourier series expansion for a continuous signal. The summation of the expansion is limited to input samples immediately adjacent in time to the desired output. This provides a "limited range" for the Fourier series expansion. Generally speaking, the output is normally desired to be a constant sampling rate, therefore, the input and output rates are related by an integer ratio. This ratio can be greater or smaller than one, providing up-sampling or down-sampling as appropriate. By employing the present invention, a digital resampling engine can be constructed that is adjustable to any ratio of sampling rates in a computationally efficient manner with low RMS (root mean squared) error while preserving convolution through the resampling process.

In FIG. 1, a block diagram 100 of a digital resampling engine in accordance with an aspect of the present invention is shown. Digital samples 102 which have been captured at a sampling frequency of "$Fs_x$," are input into the digital resampling engine 104. The digital samples 102 are processed by the digital resampling engine 104 to produce new digital samples 106 at a new sampling rate of "$Fs_y$." These new samples 106 are then made available as output data for use by other processors or displays.

Figure 2:
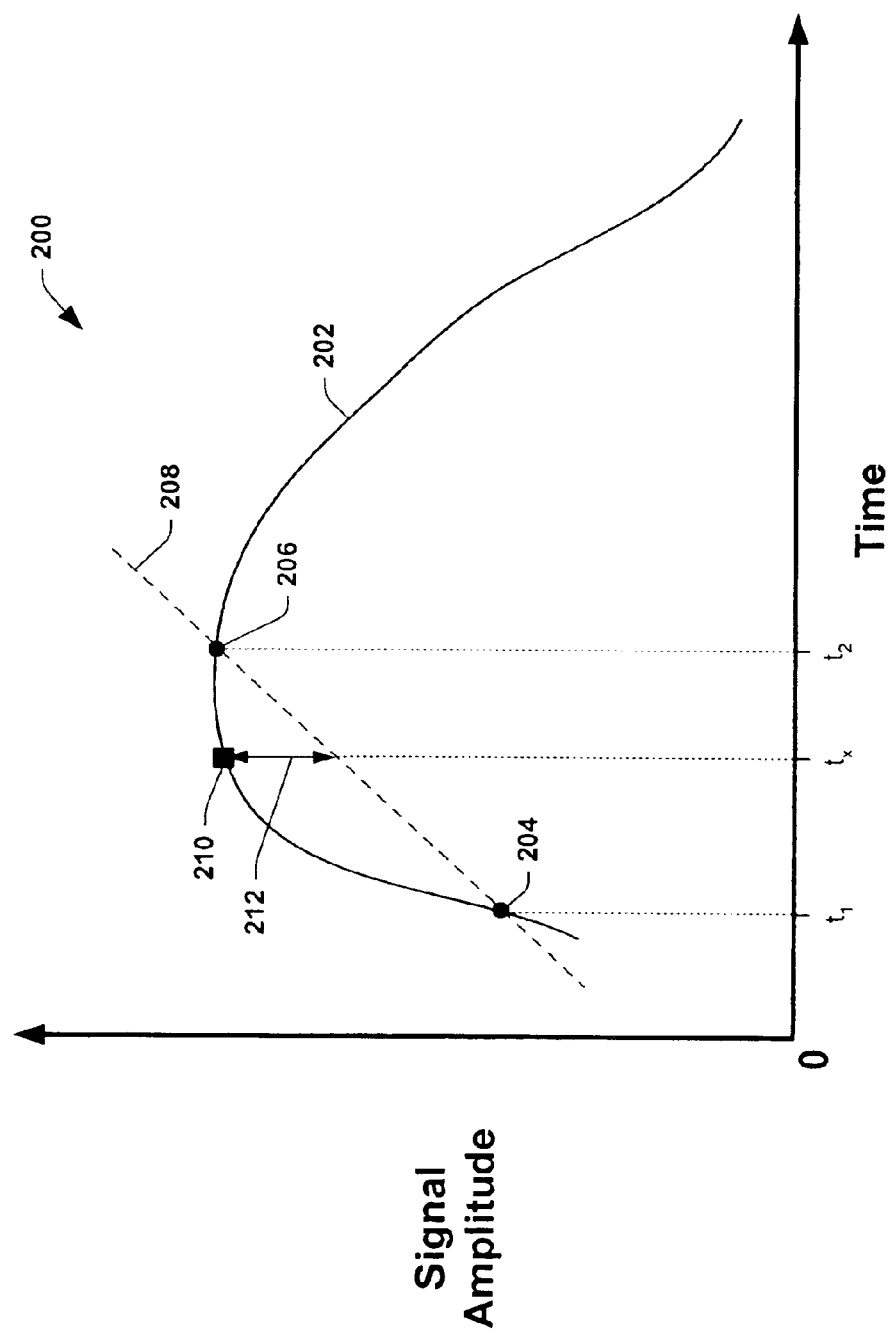
FIG. 2 illustrates an example of error in typical resampling techniques.

Typical algorithms for resampling, especially at rates that are not multiples of each other (e.g. 3:4), may introduce error into the new samples by not closely approximating the actual shape of the original signal. FIG. 2 illustrates an example 200 of error in typical resampling techniques. A continuous signal 202 has been previously sampled at a first point 204 (occurring at time, $t_1$) and a second point 206 (occurring at time, $t_2$). Assuming a different sampling rate has been chosen than that which was used for the first and second sample points 204, 206, a new sample point 210 occurring at a time, $t_x$, between the first and second points is desired. In this case, a sizable error would occur if the first and second points 204, 206 were connected by a linear approximation as depicted by a dashed line 208. The amount of error 212 is the difference between the actual magnitude of the new sample point 210 and the magnitude denoted by the dashed line 208 at time $t_x$.

In an attempt to reduce this type of error, resampling techniques may try to fit a curve to a few samples around the desired point using very computationally intensive techniques. This greatly increases processing time and inherent latency in a system. Some techniques do not preserve convolution of the original signal, which may be a necessary condition for further digital filtering. This results in the original continuous signal becoming more distorted with each processing cycle. Some curve fitting algorithms use very computationally expensive equations to come up with a set of coefficients that are valid only for the one block of input values processed. These coefficients must then be discarded and new coefficients calculated, once again increasing the latency of a system.

Digital sampling rates (analog to digital conversion) are typically chosen to optimize the digital signal processing algorithms that are performed on the samples. However, when the sampling rate must be changed, either without altering the hardware sampling rate or other upstream processing, a digital resampling process must be performed to provide the desired output. This often occurs when pre-existing equipment cannot be replaced or altered to provide a desired sampling rate due to inaccessibility or high costs of replacement.

By applying a Fourier series estimate of the input samples to produce the output samples, a new series of samples can be constructed that closely approximates the original continuous signal as though it were originally sampled at a different rate. By using the Fourier series approach, certain benefits are achieved, including potential improvements in RMS error, coefficients which are generated once and continuously reused, and less intensive computational processing techniques. The two sampling rates are usually related by an integer ratio (e.g. 2:3, 4:5, 8:5) in order to produce efficient computations for the digital resampling engine.

The present invention utilizes low order coefficients of terms of a complete expression of a Fourier series expansion for a continuous signal:

$$x_a(t) = \sum_{k=-\infty}^{\infty} x_a(kT) \frac{\sin[(\pi/T)(t-kT)]}{(\pi/T)(t-kT)} \quad \text{(Eq. 1)}$$

where $x_a(t)$ is the continuous signal and $x_a(kT)$ is the sampled signal. This Fourier series expansion equation represents an infinite number of samples denoted by "k." These samples are summed from minus infinity to plus infinity to reproduce the original continuous signal. "T" represents a sampling period (seconds per sample) of a sampling frequency, "Fs" (samples per second), and is related to the sampling frequency by T=1/Fs. "t" denotes time and a particular instance in time can be evaluated in the summation by substituting an appropriate time value for t.

Eq. 1 allows for an easy establishment of coefficients by sampling the continuous signal. It also preserves convolution if the sampling period is small enough to avoid aliasing of the two signals under consideration. This allows a discrete time linear shift-invariant system to simulate a continuous time linear time-invariant system.

Moreover, Eq. 1 relates a continuous signal to a sampled or discrete signal through a summation process. Evaluating the Fourier series expansion for an infinite number of cycles or samples requires a high level of computational effort. Truncating the summation limits would allow for a great reduction in effort. However, arbitrary selection of very low summation limits could yield undesirable results, for example, by increasing RMS error relative to the original signal, and reduce convolution performance.

For example, if Eq. 1 is modified to denote a set of input samples, "k," and an input sample period, "$T_i$," Eq. 1 becomes:

$$x_a(t) = \sum_{k=-\infty}^{\infty} x_a(kT_i) \frac{\sin[(\pi/T_i)(t-kT_i)]}{(\pi/T_i)(t-kT_i)} \quad \text{(Eq. 2)}$$

Understanding that the time "t" can be represented by t=(samples)×(seconds per sample) and substituting "I" for samples and T for seconds per sample, t can be represented by "IT." Since t represents a second set of samples, a subscript of "o" shall denote, for example, an output sample set. Utilizing Eq. 2 above and substituting $IT_o$ for t, the equation becomes:

$$x_a(IT_o) = \sum_{k=-\infty}^{\infty} x_a(kT_i) \frac{\sin[(\pi/T_i)(IT_o-kT_i)]}{(\pi/T_i)(IT_o-kT_i)} \quad \text{(Eq. 3)}$$

The new output samples are found by plugging in any arbitrary time t, (represented by $IT_o$). But, instead of summing all terms of the input out to infinity, an approximation is found by truncating the summation to the input samples immediately adjacent in time to the desired output. As a practical matter, the output is desired at a constant sample rate, so the two rates must be related by an integer ratio, where their ratio can be greater or smaller than one (up- or down-sampling). Although the two integers can take on any values, they are usually related by small numbers (e.g. 1:2, 1:4, 3:4, 6:5, etc.).

Figure 3:
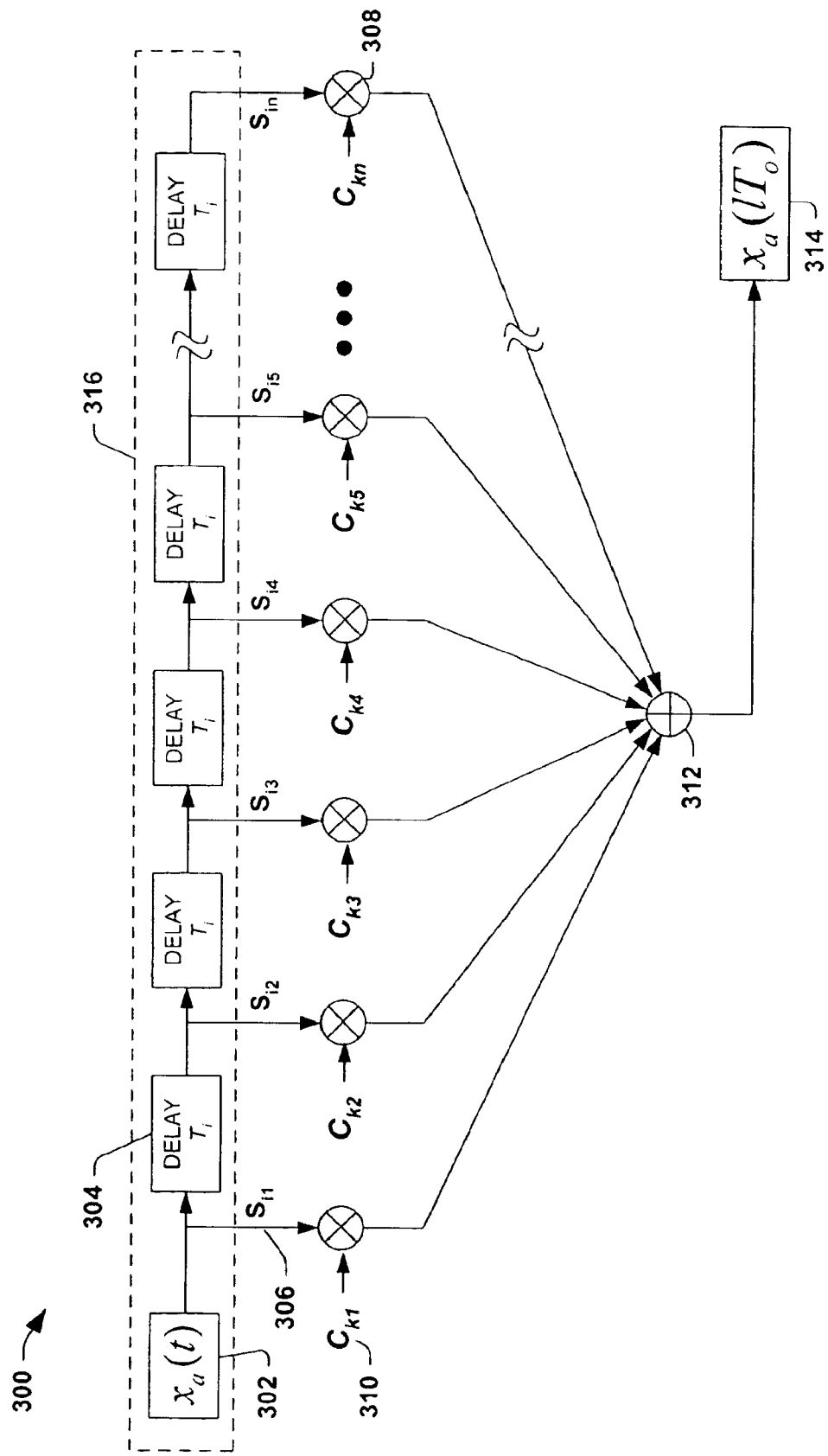
FIG. 3 shows an "n"-tap FIR filter structure in accordance with the present invention.

Turning to FIG. 3, an "n"-tap FIR (finite impulse response) filter structure 300 in accordance with the present invention is shown. A continuous signal 302, "$x_a(t)$," is input into the structure 300. After each delay period 304, "$T_i$," input samples 306, "$S_i$" (from 1 to "n" elements, where "n" denotes any integer to infinity), are multiplied 308 by corresponding coefficients 310, "$C_k$" (from 1 to "n" elements, where "n" denotes any integer to infinity). The resulting products are then summed 312 to produce a new sample for "$x_a(IT_o)$" 314, based on a desired output sample, "I." This process is repeated for each desired output sample "I." In this depiction, "k" (represented by "Si") is shown to have from 1 to "n" elements (however, the value of k could be any integer from minus infinity to plus infinity), while the range for the number of output samples "I" is left undefined (the range could include any integer from minus infinity to plus infinity). The coefficients, $C_k$ (from 1 to "n"), can be predetermined for all values of "I" before resampling. In general, the initial sampling processing denoted by a dashed line 316 is provided by an existing filter structure such as an analog to digital converter.

As an example, assume a ratio of sample rates is 4:5. In this case each set of 4 samples of the $x_a(kT)$ will take on the role of being evaluated for k=[0 . . . 3]. Using $T_i=1/Fs_i$ ($Fs_i$ is the sampling rate for the input signal), and setting $t=IT_o$ for the output signal, $T_o=1/Fs_o$, ($Fs_o$ is the desired output rate), I=number of samples, gives:

$$x_a(IT_o)\big|_{I=0...4} = \sum_{k=0}^{3} x_a(kT_i) \frac{\sin[(\pi/T_i)(IT_o-kT_i)]}{(\pi/T_i)(IT_o-kT_i)} \quad \text{(Eq. 4)}$$

This produces five output points, I=[0 . . . 4]. The next four input samples are then shifted in and the next five output samples are then computed as though the time origin had been reset to zero.

To complete this example, when setting $Fs_1$=64,000 Hz, and $Fs_o$=80,000 Hz (where "Hz" represents Hertz or "samples per second"), and expressing the above linear equations in matrix form, with four input points, k=[0 ... 3], the present invention provides five output points, I=[0 ... 4]:

$$\begin{pmatrix} o_0 \\ o_1 \\ o_2 \\ o_3 \\ o_4 \end{pmatrix} = \begin{pmatrix} 1 & 0 & 0 & 0 \\ 0.2339 & 0.9355 & -0.1559 & 0.0850 \\ -0.1892 & 0.5046 & 0.7568 & -0.2162 \\ 0.1261 & -0.2162 & 0.7568 & 0.5046 \\ -0.0585 & 0.0850 & -0.1559 & 0.9355 \end{pmatrix} \begin{pmatrix} i_0 \\ i_1 \\ i_2 \\ i_3 \end{pmatrix}$$

The number of input samples used on the right side of the equation can be extended in one or both directions around the desired output samples. For example, for the same I=[0 ... 4], one could use k=[−3 ... 6]. This allows the capability to decide if a process will benefit from having higher order Fourier series expansion terms included in the output samples in light of the added computational burden. The coefficients are computed once and applied to each of the incoming blocks of data.

Extending the input samples for a fixed output sample block improves the signal-to-noise ratio but the additional input samples also cause longer processing time. A balance needs to be struck between a desired fidelity (improved SNR and convolution) and the amount of tolerable delay caused by the processing.

Figure 4:
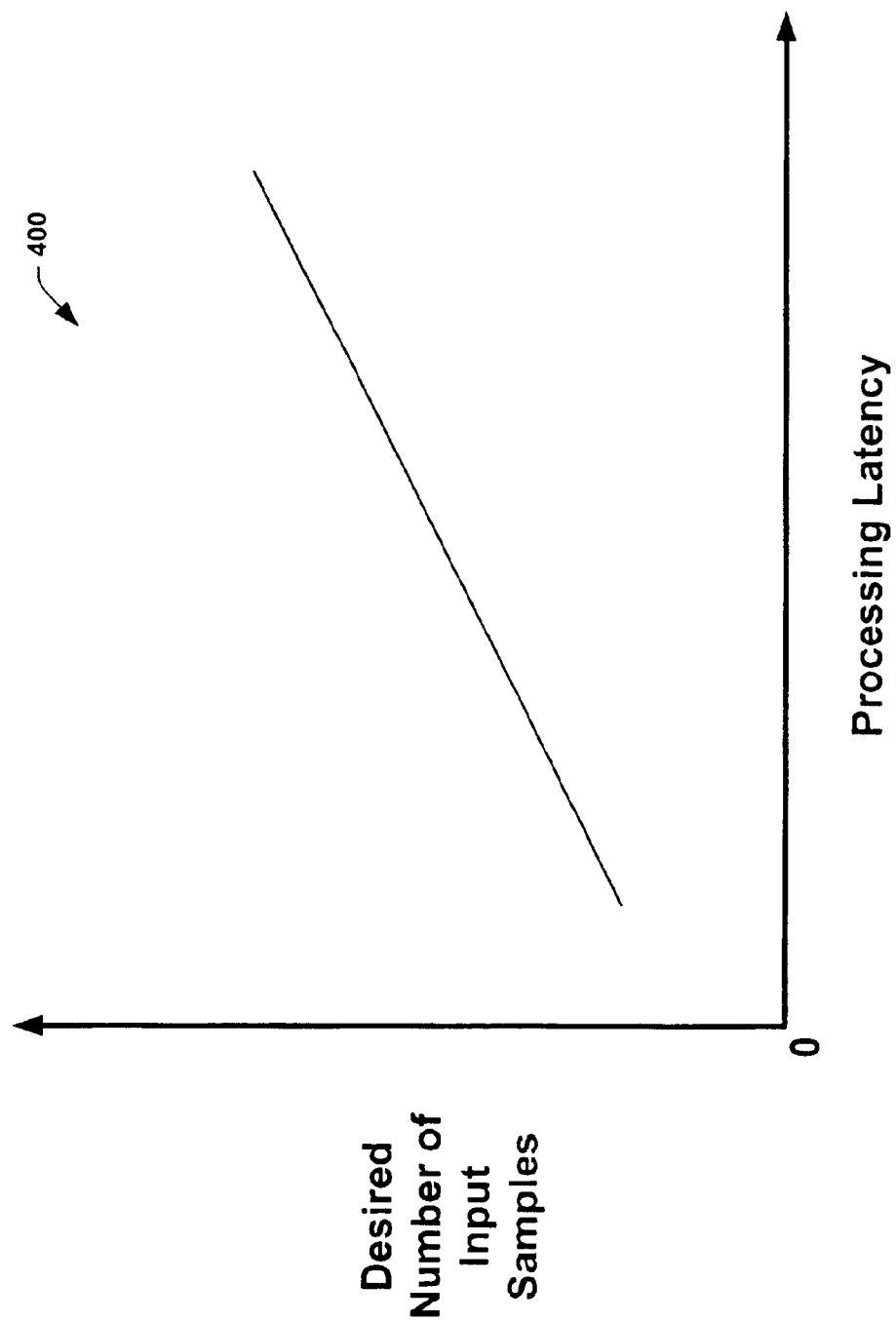
FIG. 4 is a symbolic graph depicting relative throughput latency in accordance with the present invention.
Figure 5:
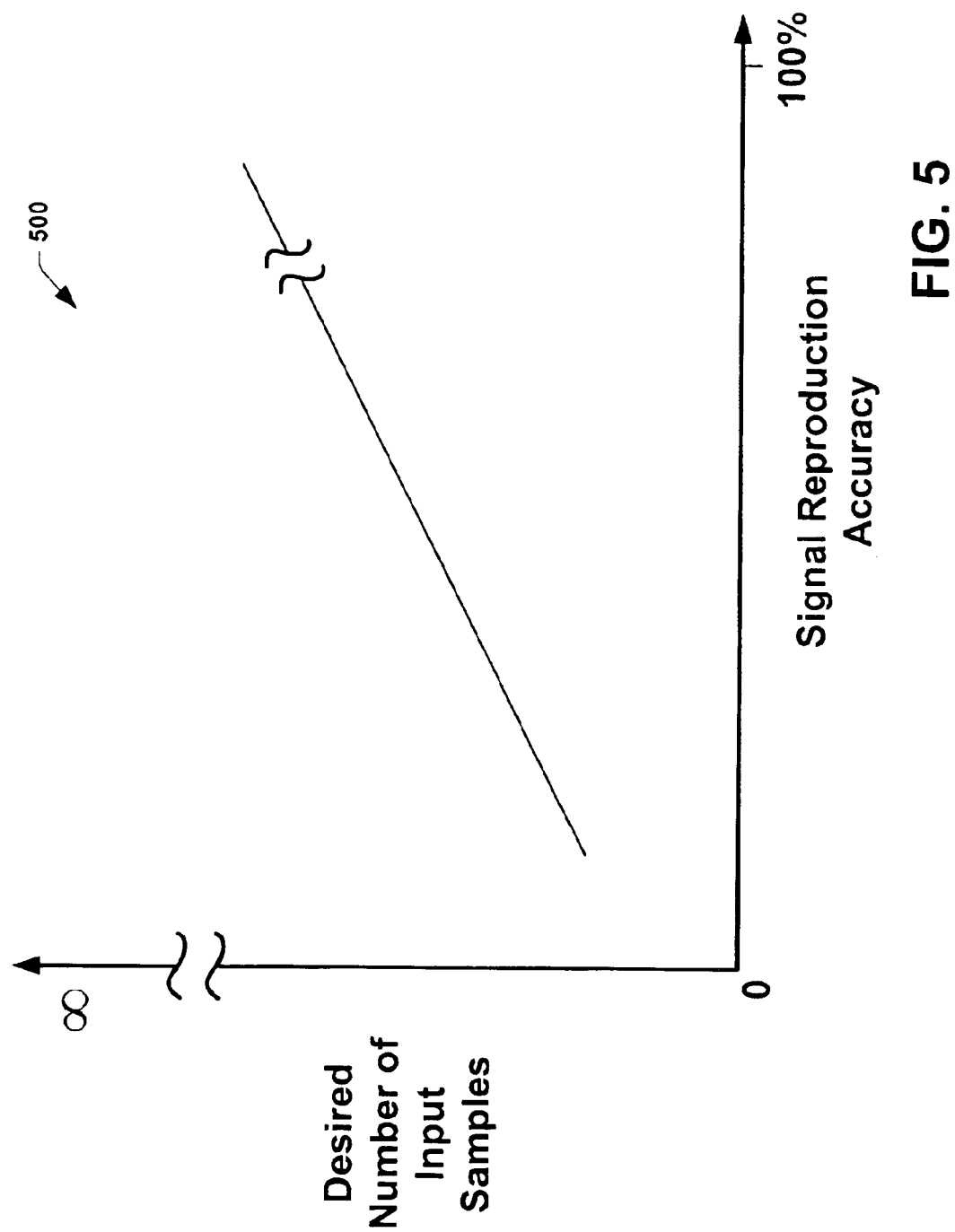
FIG. 5 is a symbolic graph depicting relative signal accuracy in accordance with the present invention.

Referring to FIG. 4, a symbolic graph 400 depicting relative throughput latency in accordance with the present invention is shown. The illustration 400 is representative in that as the desired number of input samples increases for a fixed number of output samples, processing latency will also increase. It is noted that the latency of each output point is proportional to the number of input points per block, due to the nature of the matrix multiplication of a row of k×I coefficients times the k input block. Turning to FIG. 5, a symbolic graph 500 depicting relative signal accuracy in accordance with the present invention is illustrated. This graph 500 depicts the relative nature of the desired number of input samples and the accuracy of the signal reproduction or convolution. As the desired number of input samples increases, the greater the preservation of the convolution of the original continuous signal. Generally, as the desired number of output samples per block increases, it follows that the number of input samples per block will also be increased.

Figure 6:
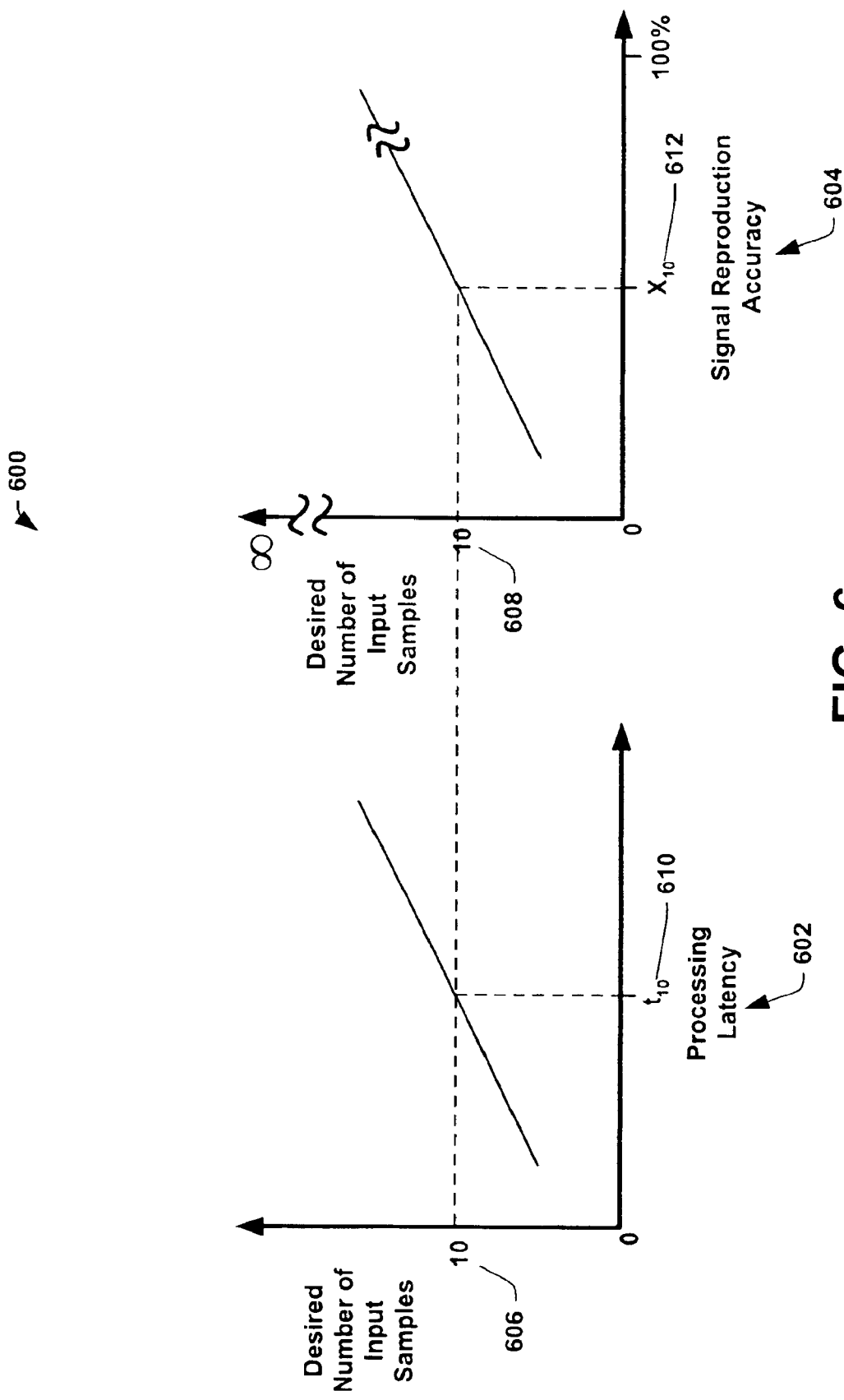
FIG. 6 is a symbolic comparison of throughput latency and signal accuracy in accordance with the present invention.

Moving on to FIG. 6, a symbolic comparison 600 of throughput latency and signal accuracy in accordance with the present invention is shown. As an example, a value of "10" 606 is chosen as the desired number of input samples for the processing latency graph 602. This value has a corresponding latency value denoted by "$t_{10}$" 610. Using the same value 608 for the desired number of input samples on the signal reproduction accuracy graph 604, a corresponding accuracy value denoted by "$X_{10}$" 612 is found. This can be construed as a value between 0 and 100% of true reproduction of the original continuous signal. A filter designer weighs the benefits of increasing the chosen sample value of 10 against the corresponding latency increase. A designer may also desire a minimum level of signal reproduction accuracy that may drive his/her choice for the number of desired input samples, with latency as a secondary consideration. Due to inherent efficiencies of the present invention, latencies are greatly reduced and may not be an overwhelming factor in the design when compared to existing sampling methods.

When performed on real sampled data, the RMS error of the present invention compared to linear interpolation given by (where $i_4$ becomes $i_0$ for the next block of data):

$$\begin{pmatrix} o_0 \\ o_1 \\ o_2 \\ o_3 \\ o_4 \end{pmatrix} = \begin{pmatrix} 1 & 0 & 0 & 0 & 0 \\ 0.8 & 0.2 & 0 & 0 & 0 \\ 0 & 0.6 & 0.4 & 0 & 0 \\ 0 & 0 & 0.4 & 0.6 & 0 \\ 0 & 0 & 0 & 0.2 & 0.8 \end{pmatrix} \begin{pmatrix} i_0 \\ i_1 \\ i_2 \\ i_3 \\ i_4 \end{pmatrix}$$

yields an improvement of nearly 8 dB of RMS error as determined from experimental results. This is attributable to the linear interpolation acting as a low-pass filter that cuts off potential signal peaks while the present invention does not.

Since the computations have a foundation in Fourier theory, the present invention has the advantage that it preserves convolution. That is, as long as the sampling rates are high enough to avoid aliasing and the number of input samples used in the blocks are sufficiently high. In this case, when a continuous signal y(t) is formed by a convolution of x(t) with h(t), then the discrete signal y(nT) approaches a convolution of x(nT) with h(nT). For given input and output block sizes, a Fourier series based interpolation provides superior convolution performance, compared to other resampling techniques of equivalent computational complexity. The described technique can also be applied to complex samples (I and Q).

Figure 7:
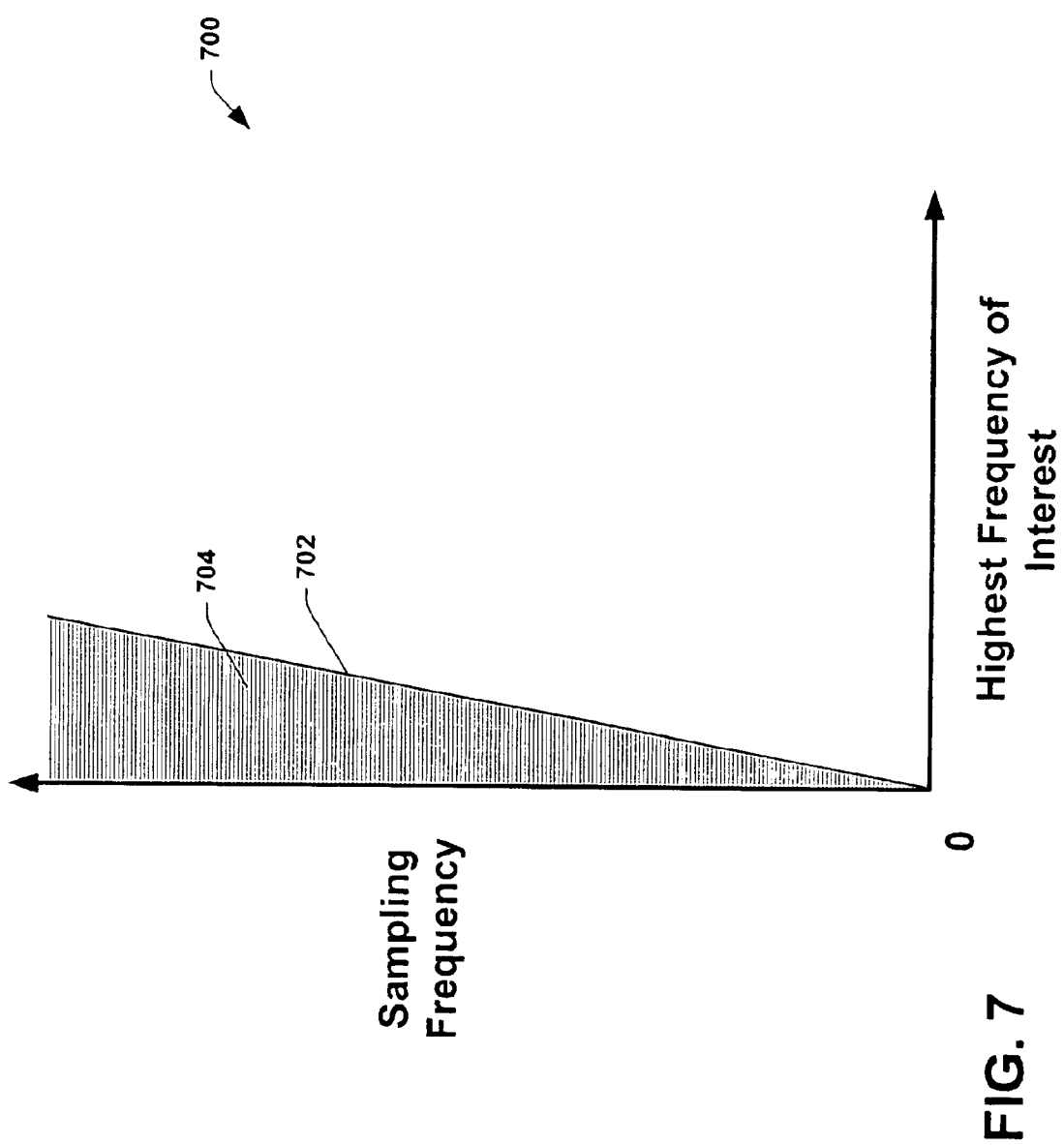
FIG. 7 is a symbolic graph relating suggested sampling frequencies in relation to frequencies of interest in accordance with the present invention.

Referring to FIG. 7, a symbolic graph 700 relating suggested sampling frequencies in relation to frequencies of interest in accordance with the present invention is depicted. Generally speaking, it is necessary to sample at least twice the highest frequency of interest. This relationship is known in the art as the Nyquist criterion. However, it has been found that sampling at least 5 to 10 times the frequency of interest gives a better approximation of the true original signal. A line 702 on the graph 700 represents 5 times the frequency of interest. The area 704 to the left of this line represents the ideal frequency region for sampling. Accordingly, this also results in 2.5 to 5 times or more the number of sample points compared to the Nyquist criterion.

Figure 8:
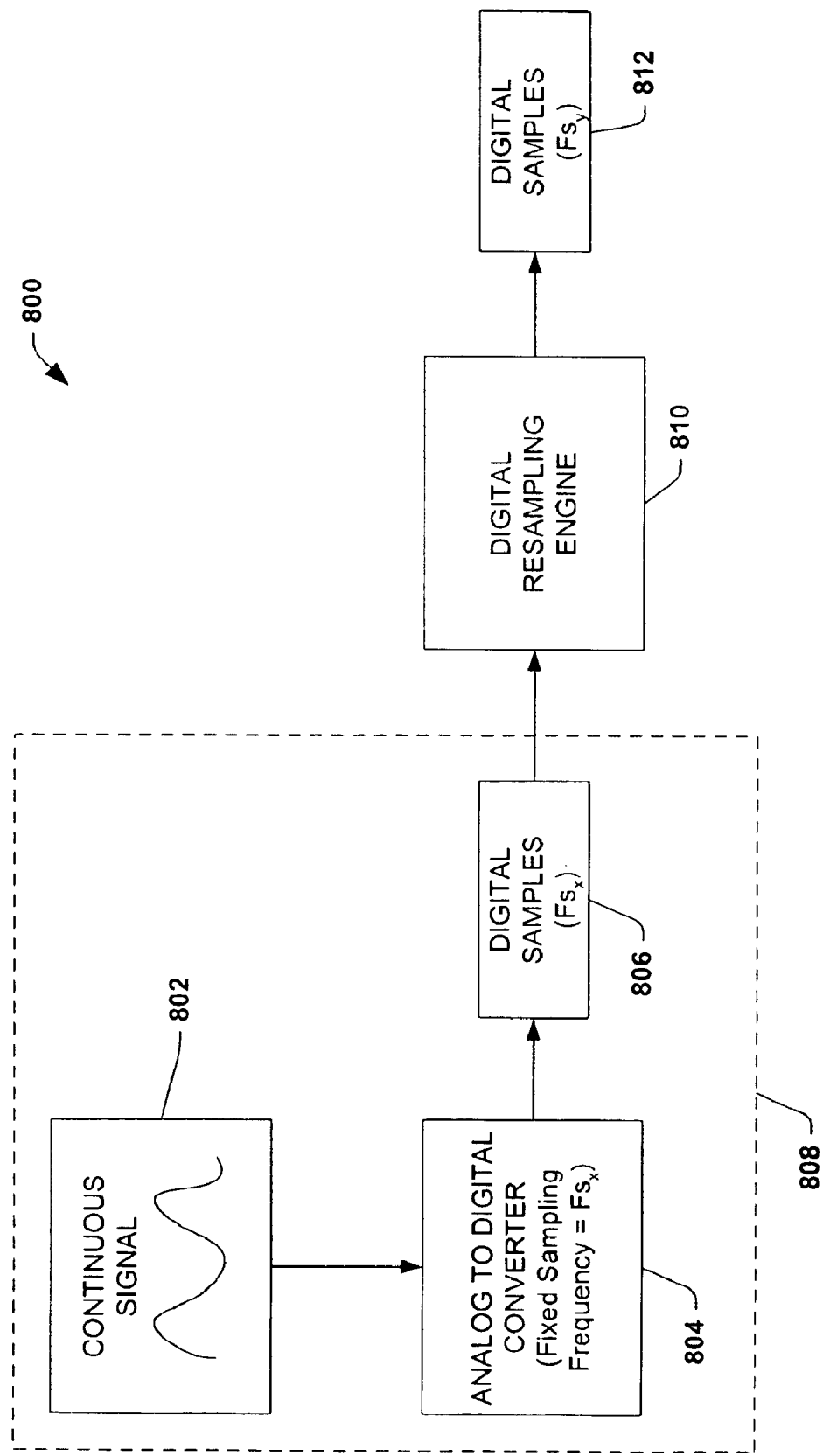
FIG. 8 is a block diagram of a system utilizing a digital resampling engine in accordance with an aspect of the present invention.

In FIG. 8, a block diagram of a system 800 utilizing a digital resampling engine in accordance with an aspect of the present invention is shown. In a typical application a continuous signal 802 is produced that needs to be processed in a digital domain. For this to occur, the continuous signal 802 must be first "digitized" or converted into discrete components. Once this is accomplished, digitally based processing can take place. Generally, a device called an analog-to-digital converter 804 or "ADC" is used for the conversion process. The ADC 804 receives the continuous signal and "samples" the data at a fixed frequency based upon some prior design or hardware limitation. Thus, the ADC 804 has a fixed sampling frequency, "$Fs_x$." Digital samples 806 based on this sampling frequency, $Fs_x$, are output to a system. The continuous signal 802, ADC 804, and digital samples 806 are often part of a pre-existing system 808 denoted by a dashed box.

Frequently, it is desirable to have other sampling frequencies available to the system besides the frequency available from the ADC 804. The present invention, in this instance, provides this function through a digital resampling engine 810 which resamples the digital samples 806 coming from the ADC 804. After the digital resampling engine 810 processes the digital samples 806, new digital samples 812 are produced based on a new sampling frequency, $Fs_y$. The new samples 812 preserve the convolution of the original continuous signal 802.

Figure 9:
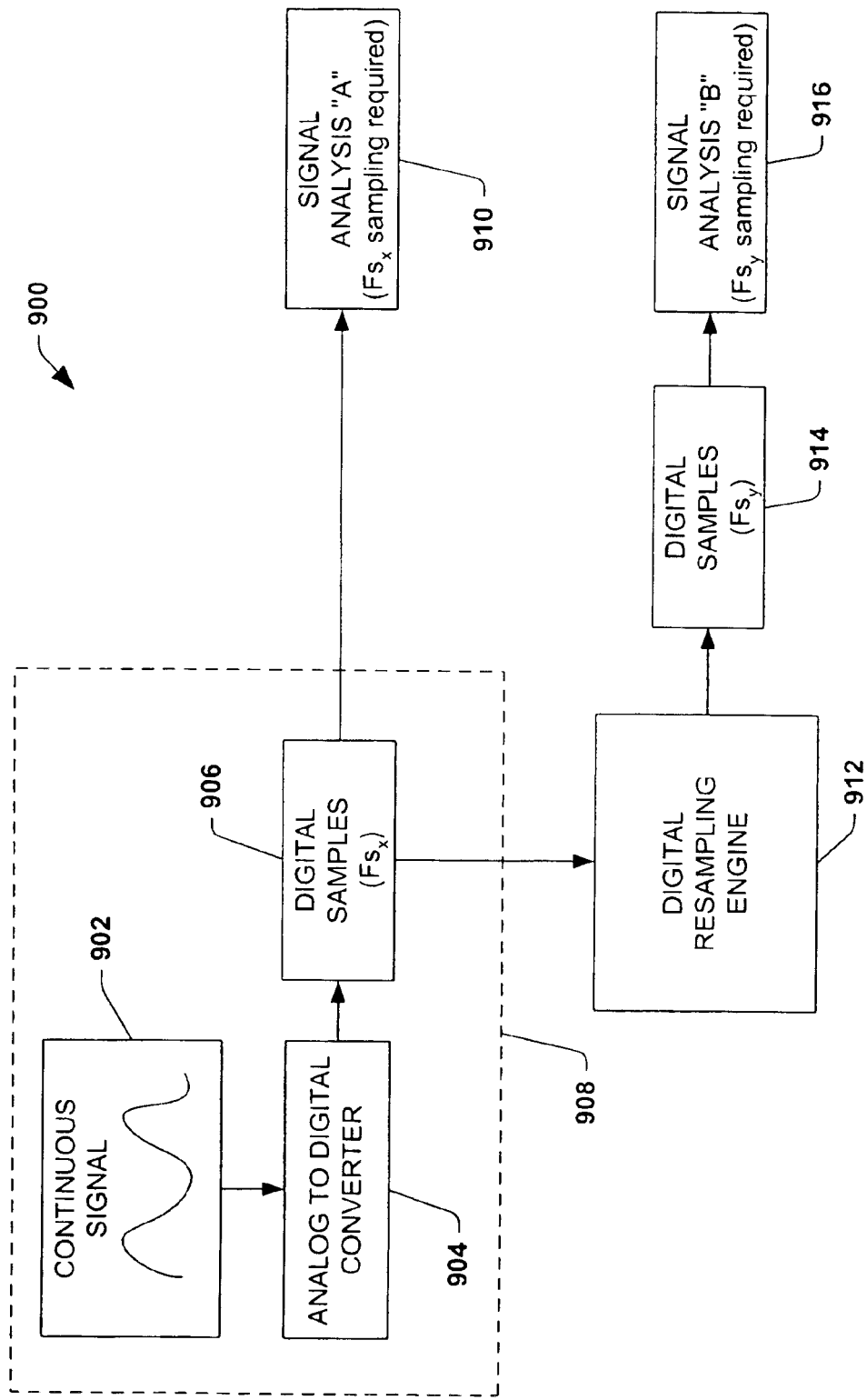
FIG. 9 is a block diagram of another system utilizing a digital resampling engine in accordance with an aspect of the present invention.

Turning to FIG. 9, a block diagram of another system 900 utilizing a digital resampling engine in accordance with an aspect of the present invention is shown. Once again a continuous signal 902 is captured and converted to digital samples 906 through an analog to digital converter 904. The digital samples 906 are based on a set frequency, $Fs_x$, of the ADC 904. Generally, these components are part of a pre-existing system 908, denoted by a dashed box. In this instance, the digital samples 906 are being processed by a signal analysis method "A" 910. This method required that the digital samples 906 be sampled at a sampling frequency of $Fs_x$. Thus, the hardware used to provide the digital samples 906 was fixed at that frequency (normally done to reduce costs of the equipment rather than provide a variable frequency converter which would increase the cost). If a new signal analysis method "B" 916 is developed that would prove beneficial to the pre-existing system 908, it cannot be employed unless it relies solely on the digital samples 906 based on the $Fs_x$ sampling frequency.

In this instance, signal analysis method "B" requires a sampling frequency of "$Fs_y$," not $Fs_x$. In order to provide the signal analysis method "B" with the appropriately sampled data, the present invention digital resampling engine 912 is employed to convert the digital samples 906 based on the $Fs_x$ frequency to new digital samples 914 based on the required sampling frequency $Fs_y$ of signal analysis method "B." This allows the pre-existing system 908 to add more capabilities and flexibility, extending its life cycle. Costs are also reduced by not requiring that pre-existing hardware be pulled and redesigned to meet the addition of signal analysis "B" 916.

Figure 10:
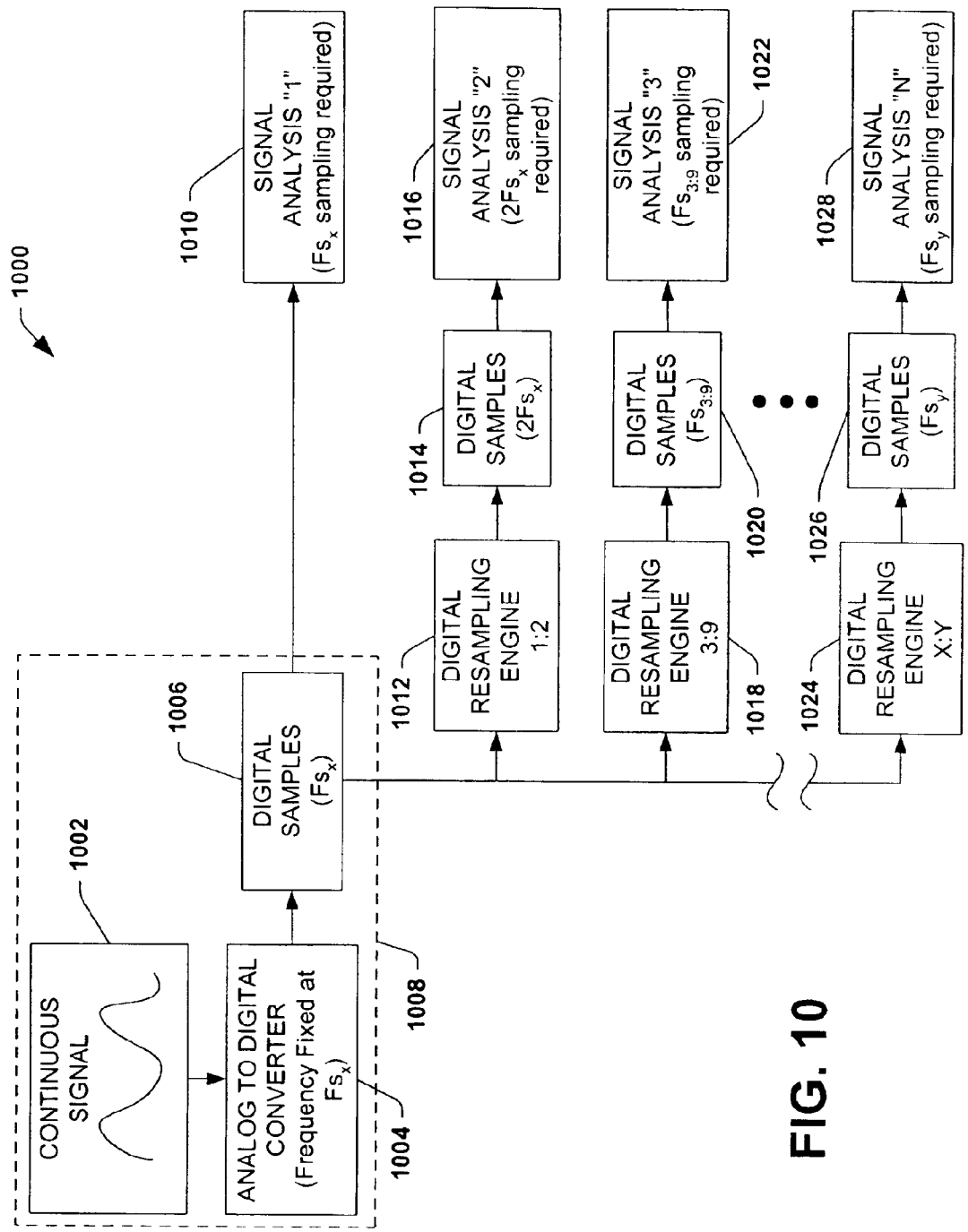
FIG. 10 is a block diagram of a system utilizing multiple digital resampling engines in accordance with an aspect of the present invention.

Referring to FIG. 10, a block diagram of a system 1000 utilizing multiple digital resampling engines in accordance with an aspect of the present invention is depicted. In this instance of the present invention, a system 1000 utilizes the present invention in conjunction with a pre-existing system 1008 to gain additional functionality. A continuous signal 1002 is converted by an ADC 1004 to produce digital samples 1006 based on the ADC's inherent sampling frequency of $Fs_x$. The pre-existing system 1008 was originally intended as a producer of the digital samples 1006 for a signal analysis method "1" 1010. This signal analysis method "1" 1010 requires the digital samples 1006 to be based on a sampling frequency of $Fs_x$. Future system designs may require new types of signal analysis that add new functionalities such as low pass, high pass, and bandpass filters and the like. The present invention can be utilized to fulfill these needs.

FIG. 10 illustrates an example where several new filters are required, represented by signal analysis methods "2" to "N" 1016, 1022, 1028, where "N" represents any integer to infinity. These are in addition to a signal analysis method "1" 1010 which was designed to utilize the digital samples 1006 that are obtained with the sampling frequency $Fs_x$. Signal analysis method "2" 1016 requires data sampled at twice the $Fs_x$ sampling frequency. A 1:2 ratio digital resampling engine 1012 provides $2Fs_x$ based digital samples 1014 to signal analysis method "2" 1016. The $2Fs_x$ based digital samples 1014 are created by the 1:2 ratio digital resampling engine 1012 from an input of the digital samples 1006 based on the $Fs_x$ sampling frequency. Signal analysis method "3" 1022 requires a more elaborate sampling frequency of $Fs_{3:9}$. Thus, a 3:9 ratio digital resampling engine 1018 provides $Fs_{3:9}$ based digital samples 1020 to signal analysis method "3" 1022. The $Fs_{3:9}$ based digital samples 1020 are created by the 3:9 ratio digital resampling engine 1018 from an input of the digital samples 1006 based on the $Fs_x$ sampling frequency.

Signal analysis method "N" 1028 represents the Nth method in the system 1000. It can be the last method of any number of methods. A sampling frequency of $Fs_y$ is required for signal analysis method "N" 1028. Sampling frequency $Fs_y$ represents any desired sampling frequency required by the system 1000. Thus, a generic ratio X:Y digital resampling engine 1024 is shown to represent that the present invention can be utilized in any desired integer ratio required by the system 1000. The $Fs_y$ based digital samples 1026 required by signal analysis "N" 1028 are created by the X:Y ratio digital resampling engine 1024 from an input of the digital samples 1006 based on the $Fs_x$ sampling frequency. In this manner any number of digital resampling engines can be employed as needed by the system 1000. This allows pre-existing systems to greatly improve their usefulness and service lives.

The multitude of digital resampling engines of the present invention described supra, can be used anywhere a FIR type filter is desired. This can include signal filtering to obtain low pass, high pass and/or bandpass type information. Due to the nature of the present invention to preserve convolution of the original continuous signal, the present invention can be employed in cascaded form also. That is, the output of one digital resampling engine can be the input of a second digital sampling engine and so forth. This would allow taps for a multitude of new sampling frequencies based on the original sampling frequency such as $Fs_x$ in the instance supra.

Figure 11:
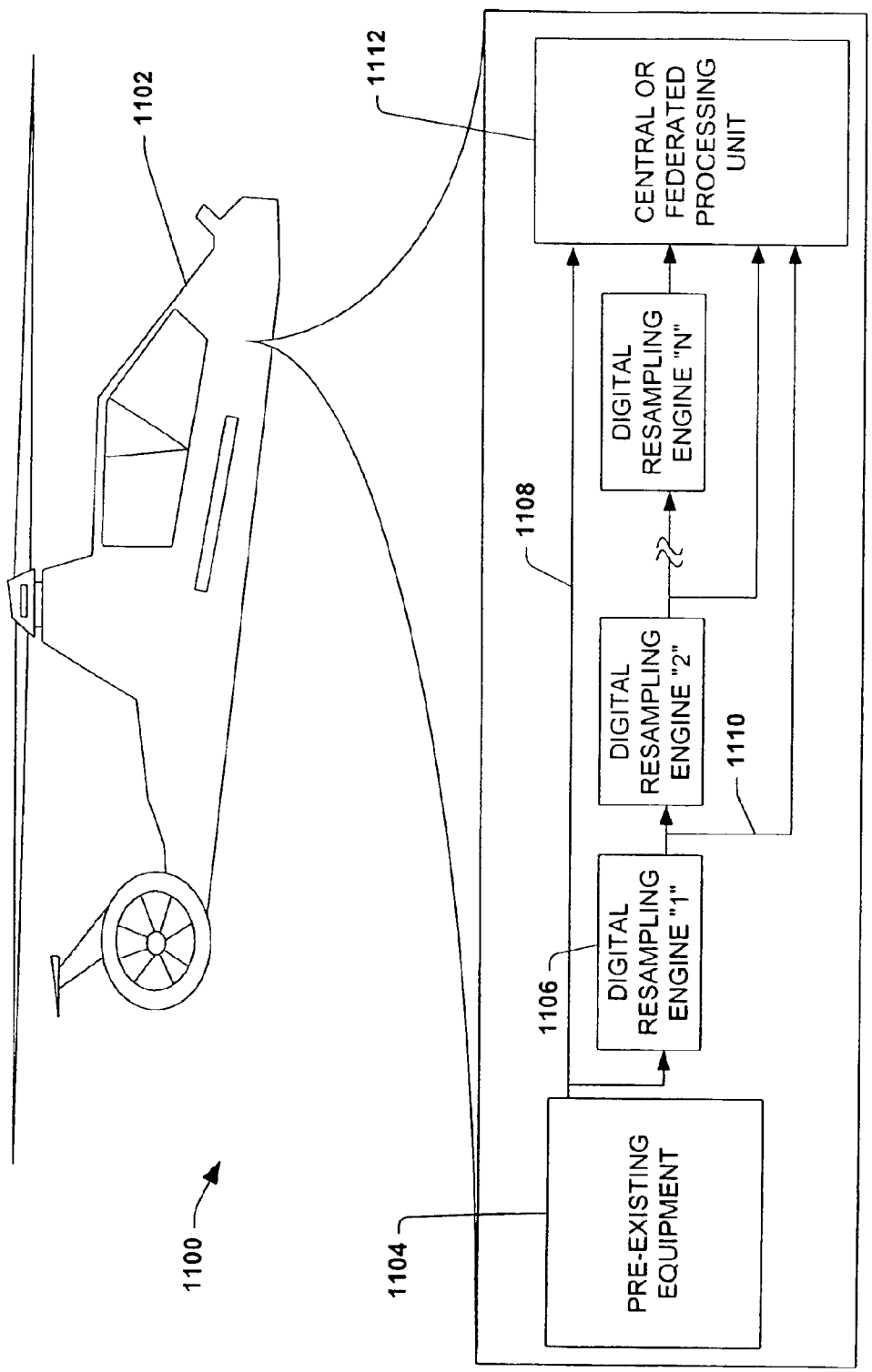
FIG. 11 is a block diagram of a system utilizing multiple cascaded digital resampling engines in accordance with an aspect of the present invention.

Turning to FIG. 11, a block diagram of a system 1100 utilizing multiple cascaded digital resampling engines in accordance with an aspect of the present invention is depicted. In this illustration, a system 1100, such as a radio system from a helicopter 1102 and the like, is shown employing cascaded digital resampling engines 1106 of the present invention. A pre-existing equipment set 1104 provides digital samples 1108 based on a preset fixed sampling frequency. The digital samples 1108 are fed to the cascaded digital resampling engines 1106 and also to a central or federated processing unit 1112 depending on the initial design of the system 1100. Taps 1110 are shown after each digital resampling engine 1106 and are fed into the central or federated processing unit 1112 as required. This allows the system 1100 to have a set of digital samples available at various frequencies. Due to the inherent nature of the present invention having low throughput latencies and preserving convolution, the cascaded digital engines 1106 can be utilized without drastically reducing the efficiency of the system 1100.

The present invention provides a simple technique that can be applied to any ratio of sampling rates, is fairly computationally efficient (only one set of coefficients is needed for all blocks of data processed, and each block of input data produces one block of output data), has low RMS error, and preserves convolution through the resampling process.

It is significant to note that the present invention is not limited to only an add-on device or method to existing platforms. Although it greatly enhances existing DSP devices, it can also be implemented directly into a DSP device. Thus, it becomes an integral part of the DSP device.

Furthermore, the present invention is useful in many suitable devices requiring digital signal processing. For example, the digital resampling engine is useful in computers, industrial equipment, hand-held devices, telecommunications equipment, medical equipment, research and development equipment, radar/satellite devices, and the like. Hand-held devices, and particularly hand-held electronic devices, achieve improvements in processing throughput due to the efficiency of the present invention.

Examples of hand-held devices include cell phones and other two way communication devices, personal data assistants, palm pilots, notebook computers, remote controls, recorders (video and audio), radios, small televisions and web devices, and the like.

Figure 12:
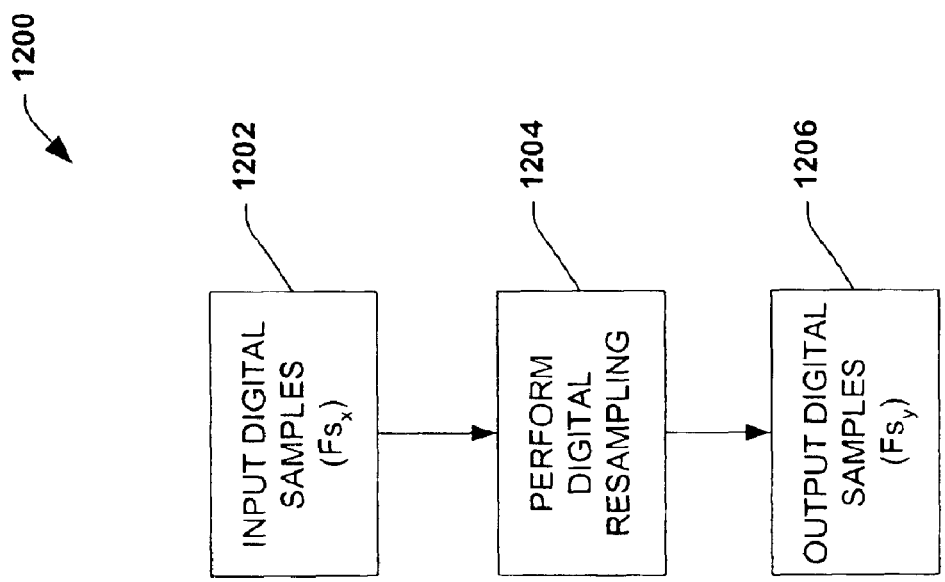
FIG. 12 is a flow diagram illustrating a method of resampling digital data in accordance with an aspect of the present invention.

In view of the exemplary systems shown and described above, methodologies, which may be implemented in accordance with one or more aspects of the present invention, will be better appreciated with reference to the flow diagram of FIG. 12. While, for purposes of simplicity of explanation, the methodology is shown and described as a series of function blocks, it is to be understood and appreciated that the present invention is not limited by the order of the blocks, as some blocks may, in accordance with the present invention, occur in different orders and/or concurrently with other blocks from that shown and described herein.

Moreover, not all illustrated blocks may be required to implement a methodology in accordance with one or more aspects of the present invention. It is to be appreciated that the various blocks may be implemented via software, hardware a combination thereof or any other suitable means (e.g. device, system, process, component) for carrying out the functionality associated with the blocks. It is also to be appreciated that the blocks are merely to illustrate certain aspects of the present invention in a simplified form and that these aspects may be illustrated via a lesser and/or greater number of blocks.

In FIG. 12, a flow diagram illustrating a method 1200 of resampling digital data in accordance with an aspect of the present invention is shown. Digital samples based on a sampling frequency of $Fs_x$ are input 1202. Digital resampling is then performed 1204 on the input $Fs_x$ based digital samples as discussed in detail supra. Digital samples based on a sampling frequency of $Fs_y$ are then output 1206.

By applying a Fourier series estimate of the input samples to produce the output samples, a new series of samples (based on $Fs_y$) can be constructed that closely approximates the original continuous signal as though it were originally sampled at a different rate. By using the Fourier series approach, certain benefits are achieved, including potential improvements in RMS error, coefficients which are generated once and continuously reused, and less intensive computational processing techniques. The two sampling rates are usually related by an integer ratio in order to produce efficient computations for the digital resampling engine.

The number of input samples used can be extended in one or both directions around the desired output samples. This allows the capability to decide if a process will benefit from having higher order Fourier series expansion terms included in the output samples in light of the added computational burden. The coefficients are computed once and applied to all incoming blocks of data.

Extending the input samples improves the signal-to-noise ratio but the additional input samples also cause longer processing time. A balance needs to be struck between a desired fidelity (better convolution performance) and the amount of tolerable delay caused by the processing.

Since the computations have a foundation in Fourier theory, the present invention has the advantage that it preserves convolution. That is, as long as the sampling rates are high enough to avoid aliasing and the number of input samples used in the blocks are sufficiently high. In this case, when a continuous signal y(t) is formed by a convolution of x(t) with h(t), then the discrete signal y(nT) approaches a convolution of x(nT) with h(nT). The described technique can also be applied to complex samples (I and Q). The digital resampling represented at block 1204 can also include cascaded and parallel digital resampling engines.

Figure 13:
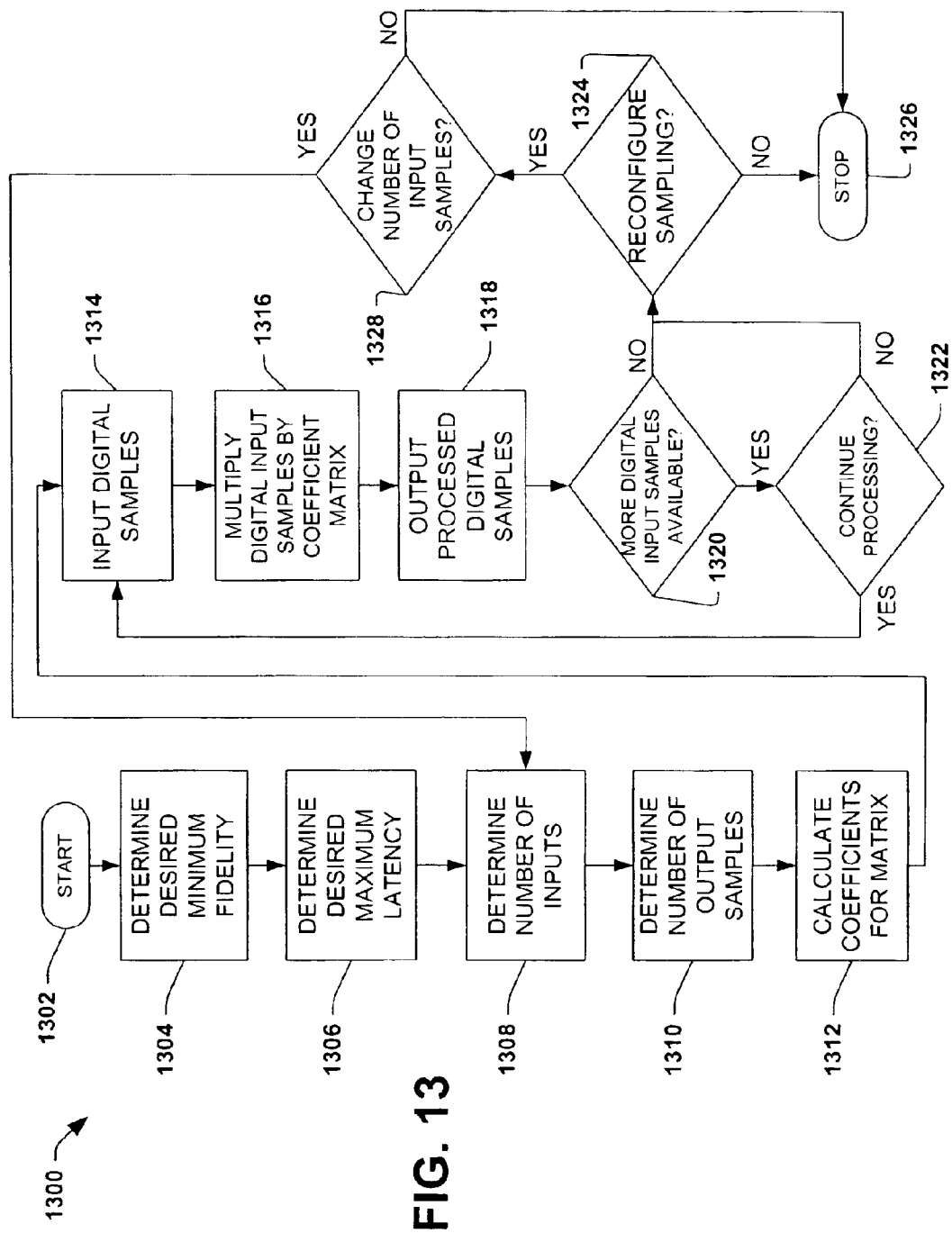
FIG. 13 is a flow diagram illustrating another method of resampling digital data in accordance with an aspect of the present invention.

Turning to FIG. 13, a flow diagram illustrating another method 1300 of resampling digital data in accordance with an aspect of the present invention is depicted. The method 1300 starts 1302 by first determining a desired minimum level of fidelity required 1304. Maintaining signal accuracy or convolution of the original signal may have more emphasis placed on it in methods where the filtering is done in a serial fashion or cascaded. When those methods are employed, errors in each filter are magnified by the filter it feeds into, leading to a final result with a large magnitude of error.

In the next step, a maximum amount of latency or delay is determined 1306. The present invention provides for an efficient means with low relative latency, but when sampling numbers increase, the latency will also increase. Some very fast processing situations may require extremely low latencies which must be taken into account.

Once desired latency and fidelity have been established, the number of digital sample inputs can be determined 1308 and the number of digital sample outputs can also be determined 1310. Having a latency parameter along with a fidelity parameter allows a designer to decide how many input and output samples are too much for that particular design in terms of throughput and signal quality. In general, the input samples are chosen immediately adjacent in time to the desired output samples.

After establishing the number of inputs and outputs, the coefficients for the coefficient matrix can be calculated 1312. The digital samples are then input 1314 and multiplied by the coefficient matrix 1316. The resulting products are the resampled digital samples which are available as outputs 1318. If more digital samples are available 1320 and the process is continued 1322, the flow returns to input digital samples 1314. If the process is not to be continued 1322 and reconfiguring is not required 1324, the process ends 1326. If more digital samples are not available for resampling 1320 and reconfiguring the sampling is not required 1324, the process ends 1326. If the sampling is to be reconfigured 1324 due to such things as, for example, desiring better fidelity of the continuous signal represented by the output digital samples (which may require more input digital samples) and the number of input samples is to change 1328, the process starts over at the step of determining the number of inputs 1308. Otherwise, the process ends 1326.

What has been described above is one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description or the claims, such term is intended to be inclusive in a manner similar to the term "comprising."

What is claimed is:

1. A method of resampling a digital signal, comprising:

receiving at least one input sample of a continuous signal sampled at a first sample rate;

formulating a Fourier series expansion of the continuous signal;

establishing a limited range of the Fourier series expansion, the limited range approximately including at least one input sample immediately adjacent in time to at least one desired output sample of a second sample rate; and summing terms of the Fourier series expansion of the continuous signal over the limited range.

2. The method of claim 1, further including:

obtaining a continuous signal; and sampling the continuous signal at the first sample rate to provide at least one input sample.

3. The method of claim 2, the first sample rate and the second sample rate are related by an integer ratio.

4. The method of claim 3, wherein the first sample rate is an input sample rate and the second sample rate is an output sample rate.

5. The method of claim 3 wherein the integer ratio is selected from a group consisting of smaller than one and greater than one.

6. The method of claim 1, further including:

formulating at least one coefficient derived from the Fourier series expansion and the limited range; and multiplying the at least one coefficient with at least one input sample to produce at least one output sample.

7. The method of claim 1, further including establishing a number of input samples based on a maximum desired throughput latency.

8. The method of claim 1, further including establishing a number of input samples based on a minimum desired continuous signal reproduction accuracy level.

9. A digital data resampling system, comprising:

a capturing component that receives digital data; and a digital sampling engine that receives the digital data from the capturing component, and determines a Fourier series summation range that is immediately adjacent in time to a desired digital data output, the engine resampling the digital data utilizing a Fourier series expansion summed over the Fourier series summation range.

10. The system of claim 9 employing the following equation:

$$x_a(IT_o) = \sum_{k=-\infty}^{\infty} x_a(kT_i) \frac{\sin[(\pi/T_i)(IT_o - kT_i)]}{(\pi/T_i)(IT_o - kT_i)}$$

where:

$x_a(IT_o)$ represents a continuous signal;

$x_a(kT_i)$ is a sampled signal;

k represents an infinite number of samples;

$T_i$ represents an input sampling period (seconds per sample) of a sampling frequency;

$T_o$ represents an output sampling period (seconds per sample) of a sampling frequency;

I represents output samples;

Fs is a sampling frequency (samples per second) and is related to a sampling period by T=1/Fs; and $IT_o$ represents time [(samples)×(seconds per sample)].

11. The system of claim 9, further comprising an "n"-tap FIR (finite impulse response) filter.

12. The system of claim 1 employed in a conventional DSP system so as to provide additional functionality gains to the conventional DSP system.

13. A computing system employing the system of claim 9, a computer readable medium comprising the digital sampling engine and the capturing component.

14. The system of claim 9, the digital sampling engine determines if more digital samples are available for processing and further determines if processing should continue when more digital samples are available.

15. A method of resampling digital data, comprising;

determining a number of digital sample inputs;

determining a desired minimum fidelity for a desired digital output signal;

determining a desired maximum latency for processing a set of desired digital sample outputs;

determining a desired number of digital output samples;

calculating coefficients for processing the digital sample outputs based on a Fourier series expansion over a limited range, the limited range approximately including at least one input sample immediately adjacent in time to at least one desired output sample of a second sample rate;

inputting digital samples;

processing the digital samples by multiplying the digital samples by the coefficients; and outputting a resampled set of digital samples.

16. The method of claim 15, further comprising:

determining if samples are available for processing; and determining if more processing should continue when more digital samplers are available.

17. The method of claim 15, further comprising:

determining if sampling parameters should be reconfigured; and determining if the number of digital sample inputs should be charged based up a predetermined level of continuous signal reproduction accuracy.

18. A digital data resampling system, comprising:

means to receive digital data and determine a Fourier series summation range that is immediately adjacent in time to a desired digital data output;

means to resample the digital data utilizing a Fourier series expansion summed over the Fourier series summation range; and means to output the resampled digital data.

19. The system of claim 18, further including means to extend the Fourier series summation range based on a desired fidelity of the resampled digital data.

* * * * *